(12) United States Patent
Terui et al.

(10) Patent No.: US 6,903,499 B2
(45) Date of Patent: Jun. 7, 2005

(54) ELECTRON GUN AND A METHOD FOR USING THE SAME

(75) Inventors: Yoshinori Terui, Gunma (JP); Shinpei Hirokawa, Gunma (JP); Katsuyoshi Tsunoda, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 213 days.

(21) Appl. No.: 09/985,737

(22) Filed: Nov. 6, 2001

(65) Prior Publication Data

US 2003/0085645 A1 May 8, 2003

(51) Int. Cl.⁷ .................................................. H01J 1/02
(52) U.S. Cl. ...................... 313/309; 313/351; 313/446; 313/337
(58) Field of Search ................................ 313/351, 309, 313/631, 491, 458, 446, 336, 155, 158, 346 R, 350, 337, 335

(56) References Cited

U.S. PATENT DOCUMENTS

| | | | |
|---|---|---|---|
| 4,430,570 A | | 2/1984 | Takigawa et al. |
| 4,468,586 A | * | 8/1984 | Hohn .......................... 313/336 |
| 4,482,838 A | | 11/1984 | Ishii et al. |
| 4,482,839 A | | 11/1984 | Wada et al. |
| 4,924,136 A | * | 5/1990 | Lischke et al. ............. 313/336 |
| 5,616,926 A | * | 4/1997 | Shinada et al. .......... 250/423 F |
| 5,837,165 A | | 11/1998 | Otani et al. |
| 6,392,333 B1 | * | 5/2002 | Veneklasen et al. ..... 313/361.1 |

OTHER PUBLICATIONS

D. W. Tuggle, et al. "Emission Characteristics of the ZrO/W Thermal Field Electron Source," J. Vac. Sci. Technol. B 3 (1), 1985. pp. 220–223.
Ken Harada, et al., Journal of Electron Microscopy, vol. 40, No. 1, pp. 1–4, XP–000234583, "Single–Crystal LaB$_6$ as Thermal Field Emitter of High Brightness Electron Source", Feb. 1, 1991.
Patent Abstracts of Japan, JP 58–040729, Mar. 9, 1983.
Patent Abstracts of Japan, JP 09–129166, May 16, 1997.
Patent Abstracts of Japan, JP 08–184699, Jul. 16, 1996.
Patent Abstracts of Japan, JP 56–035342, Apr. 8, 1981.

* cited by examiner

*Primary Examiner*—Edward J. Glick
*Assistant Examiner*—Elizabeth Keaney
(74) *Attorney, Agent, or Firm*—Oblon, Spivak, McClelland, Maier & Neustadt, P.C.

(57) ABSTRACT

An electron gun includes an electron emission cathode, a control electrode, and an extractor and the electron emission cathode is made of rare earth hexaboride. A tip of the electron emission cathode is located between the control electrode and the extractor, and the electron emission surface of the electron emission cathode is spherical or flat.

8 Claims, 5 Drawing Sheets

ELECTRON GUN AND A METHOD FOR USING THE SAME

BACKGROUND OF THE INVENTION

1. Field of the Invention

The present invention relates to an electron gun used for an electron microscope, an Auger electron spectrograph, an electron beam lithography system, an electron beam LSI tester, a wafer inspection equipment or the like. In particular, it relates to an electron gun for an electron beam lithography system and electron beam LSI tester.

2. Discussion of the Background

In recent years, in order to obtain electron beams of long service life and higher brightness rather than electron beams obtainable from a thermionic cathode, there has been used an electron gun using a cathode comprising a needle electrode of <100> oriented tungsten single crystal on which a coating layer of zirconium and oxygen is formed (Hereinbelow, referred to as a ZrO/W electron gun).

In a critical dimension SEM or a wafer inspection equipment in which a low acceleration voltage is used, the ZrO/W electron gun is often used by the reason that its probe current is stable and the energy broadening of electron beam can be suppressed. In this case, the electron gun is operated at an angular intensity of 0.1–0.2 mA/sr.

Further, in the electron beam LSI tester, the electron beam lithography system or the Auger spectrograph in which throughput is considered to be important, the electron gun is operated at a higher angular intensity of about 0.4 mA/sr. However, in such usage wherein throughput is considered to be important, a further higher angular intensity is expected, and there is a demand that the electron gun is operated at a high intensity such as 1.0 mA/sr.

However, a conventional ZrO/W electron gun has such drawbacks that (1) an upper limit in operating it at a high angular intensity is at most about 1.0 mA/sr, (2) when it is operated at about 1.0 mA/sr, an extractor voltage applied between the cathode and an extractor is high as 4 kV or more, and the electric field strength at a tip of a needle electrode is extremely high as $0.4-1.0 \times 10^9$ V/m (see J. Vac. Sci. Technol. B. 3 (1) 1985, p220 "Emission Characteristics of the ZrO/W Thermal Field Electron Sources"), whereby the possibility of failure due to an arc discharge becomes high, and (3) a ultra-high vacuum condition of $1 \times 10^{-6}$ Pa or less is required.

SUMMARY OF THE INVENTION

The inventors of this application have made extensive studies in consideration of the above-mentioned, and have found the way of solving all at once the above-mentioned problems by making such contrivance that an electron emission cathode made of rare earth hexaboride is under specified construction and arrangement; a tip of the electron emission cathode has a specified shape and it is operated in a specified temperature range. Thus, the present invention has been completed.

In accordance with a first aspect of the present invention, there is provided an electron gun comprising an electron emission cathode, a control electrode and an extractor wherein the electron emission cathode is made of rare earth hexaboride and a tip of the electron emission cathode is located between the control electrode and the extractor.

According to one of preferred embodiments in the present invention, an electron emission surface of the electron emission cathode is spherical. More preferably, the apex angle of the tip portion of the electron emission cathode is 50–100°. Further, the rare earth hexaboride is preferably lanthanum hexaboride.

According to another preferred embodiment of the present invention, an electron emission surface of the electron emission cathode is flat. More preferably, the apex angle of the tip portion of the electron emission cathode is 50–100 degree. More preferably, the electron emission cathode is made of a single crystal of rare earth hexaboride and the electron emission surface of the electron emission cathode has a <100> face. Further, the rare earth hexaboride is preferably lanthanum hexaboride.

According to another preferred embodiment of the present invention, the electron emission cathode is located between two heaters made of carbon so that the electron emission cathode is heated by feeding an electric current to the electron emission cathode and the heaters. Further, the heaters of carbon are preferably composed of pyrolytic carbon.

Further, according to another preferred embodiment of the present invention, an angular intensity of 0.2–70 mA/sr is provided in the application of an extractor voltage of 1 kV.

In accordance with a second aspect of the present invention, there is provided a method of using an electron gun constituted by an electron emission cathode, a control electrode and an extractor wherein the electron emission cathode is made of rare earth hexaboride and a tip of the electron emission cathode is located between the control electrode and the extractor, the method being characterized in that the electron emission cathode is operated in a temperature limited region. According to one of preferred embodiments of the above-mentioned method of the present invention, the electron emission cathode is operated at 900–1900K. Further, the electron emission cathode is preferably operated in a pressure range of $1 \times 10^{-5}$ Pa or less.

Preferred embodiments of the present invention will be described with reference to the drawings.

Figure 1:
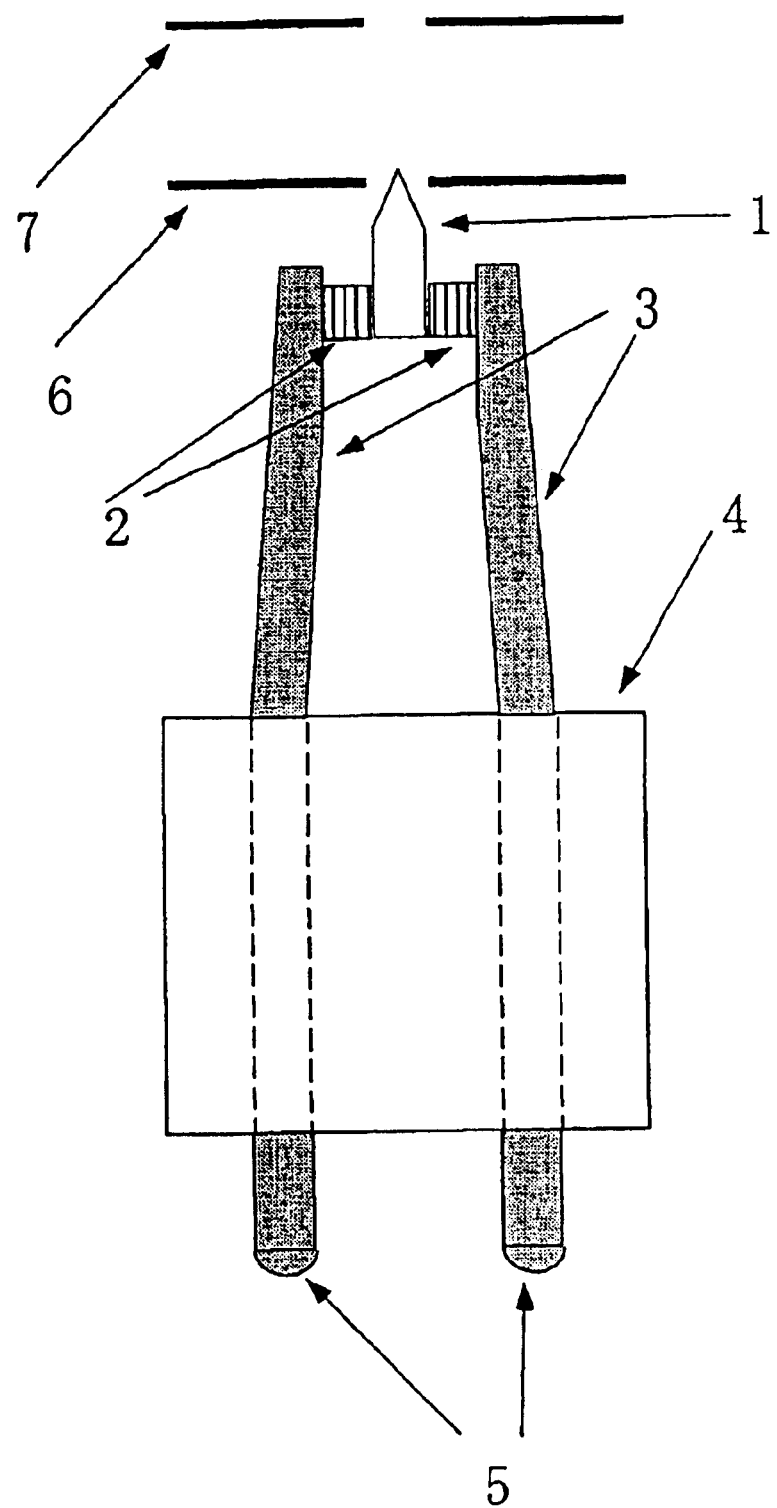
FIG. 1 is a construction diagram showing an embodiment of the electron gun according to the present invention.

FIG. 1 shows an embodiment of the electron gun of the present invention.

DESCRIPTION OF THE PREFERRED EMBODIMENTS

As shown in FIG. 1, a tip of an electron emission cathode 1 made of rare earth hexaboride is located between a control electrode 6 and an extractor 7. In the electron gun of the present invention, a high voltage, which has a negative polarity with respect to the extractor 7, is applied to the electron emission cathode 1 so that electron beam emit from the electron emission cathode 1. Further, the control electrode 6 is adapted to suppress electron emission from a side surface of the electron emission cathode 1. Generally, a negative voltage against the emission cathode is applied to the controlled electrode 6.

In the present invention, the electron emission cathode 1 may be made of a polycrystal of rare earth hexaboride. However, it is preferable that the electron emission cathode 1 is made of a single crystal because obtainable electron beam is stable and its distribution is uniform. In a case of using the single crystal, the electron emission surface of the cathode 1 has preferably a <100> face because it is a face of low work function and symmetric electron beam is obtainable. In particular, it is preferable to use lanthanum hexaboride as rare earth hexaboride because a large amount of lanthanum hexaboride is relatively available, the lanthanum hexaboride being able to form a single crystal of high quality, and the behavior under an operational condition for generating electron beams is well known.

The electron gun of the present invention using the above-mentioned construction has a feature of providing a desired angular intensity depending on the shape of the tip of the electron emission cathode 1 by operating the electron emission cathode 1 in a temperature limited region. Further, according to the result of the study by the inventors of this application, it is possible to achieve an angular intensity covering a broad range such as 0.2–70 mA/sr when an extractor voltage of 1 kV is applied. Further, since the electron emission cathode is made of the rare earth hexaboride, operation vacuum can be about $1 \times 10^{-5}$ Pa.

Figure 4:
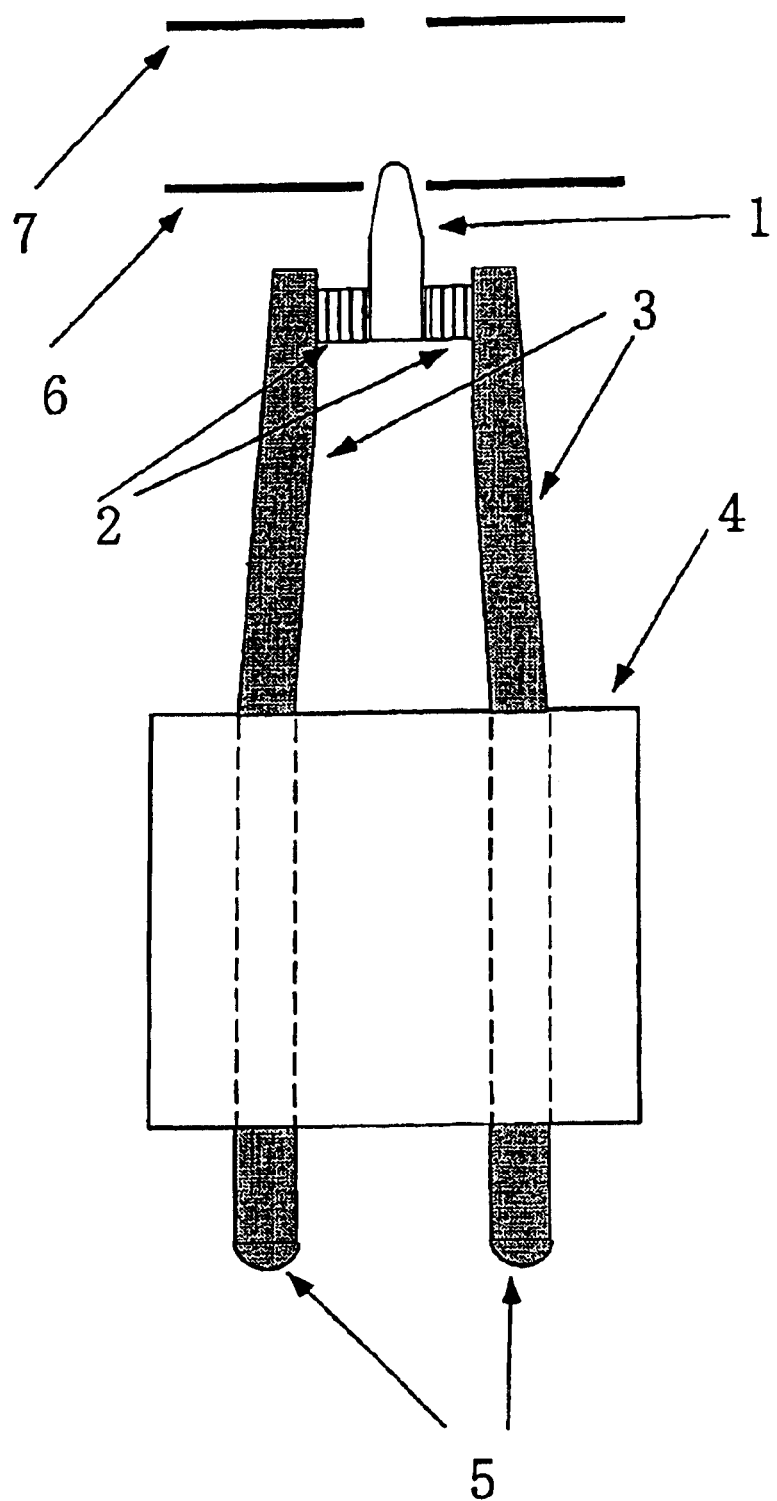
FIG. 4 is a construction diagram showing a spherical electron emission surface.
Figure 5:
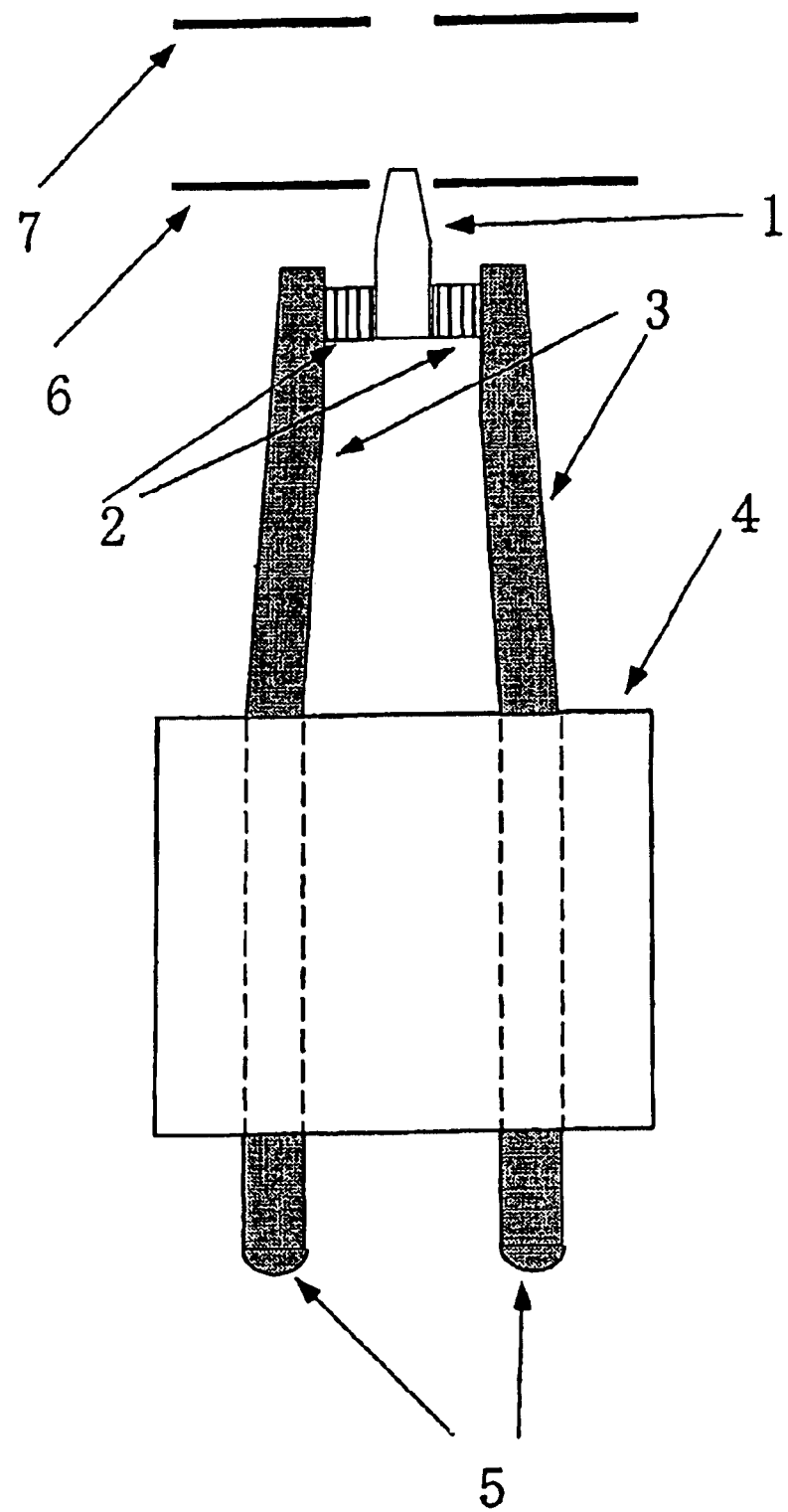
FIG. 5 is a construction diagram showing a flat electron emission surface.

Although the shape of the tip of the electron emission cathode is selected depending on a desirable angular intensity and so on, the cathode having a spherical tip as shown in FIG. 4 or a flat tip as shown in FIG. 5 is preferably selected. The former has a characteristic feature that a higher angular intensity can easily be obtained at an initial stage of operation, and the later has a characteristic feature that a stable angular intensity can easily be obtained for a long term. Accordingly, the selection can be made depending on usage. In order to obtain a desired shape of the tip of the electron emission cathode, well-known machining method, electropolishing method and so on can be used.

When the shape of the tip of the electron emission cathode is spherical, there is the influence of electron beam characteristics depending on the apex angle of the tip of the electron emission cathode. In a case that electron beam of high angular intensity are desired, the apex angle is preferably in a range of 50–100°.

When the shape of the tip of the electron emission cathode is flat, the flat portion should be in substantially correspondence with the <100> face of the single crystal of rare earth hexaboride. Such structure is further preferably because electron beams having a high angular intensity can be obtained stably. Further, in the case that the shape of the tip of the electron emission cathode is flat, the size of the flat portion is a factor affecting the electron beam characteristics. Since the flat portion is generally circular, the size is often represented by the diameter of a circle. According to experimental studies by the inventors, a diameter in numerical range of 5–200 µm is preferably selected. Further, a numerical range of 20–100 µm is further preferable, and 50–100 µm is most preferable.

The electron gun of the present invention is provided with a heater for heating the electron emission cathode. For example, as shown in FIG. 1, the electron gun is preferably provided with heater blocks 2 made of carbon, which are arranged so as to hold the electron emission cathode. It is because carbon is a substance difficult to react with rare earth hexaboride. For the heater blocks of carbon, pyrolytic carbon or graphite is preferably used in consideration of thermal conductivity and electric resistivity.

In a general way of holding the electron emission cathode by the above-mentioned heater blocks, the heater blocks 2 which hold the electron emission cathode 1 are held by holders 3 located at each other end of conductive terminals 5 which are fixed to an insulator 4 by brazing. When an electric current is fed through the conductive terminals 5, the heater blocks 2 are heated by Joule heat, whereby the electron emission cathode 1 is heated.

The temperature suitable for operating the electron emission cathode of the electron gun according to the present invention (Hereinbelow, referred simply to as the cathode temperature) is in a range of 900–1900K, preferably, 1500–1700K. According to the present invention, a high angular intensity of about 5 mA/sr can be obtained at a cathode temperature of 1700K and an extractor voltage of 1 kV or lower. Further, the angular intensity suitable for operation can be regulated in a controlled temperature range by selecting the radius of curvature or the diameter of a flat portion at the tip of the cathode. Namely, when the electron gun of the present invention is operated in a temperature limited region, electron beam having a desired angular intensity can be obtained. In this case, for example, when the extractor voltage is 1 kV and the radius of curvature at the tip is 5 µm, the electric field strength at the tip of the electron emission cathode is about $5 \times 10^7$ V/m, which is far lower than that of the ZrO/W electron gun, and accordingly, the frequency of occurrence of a damage due to arc can be minimized. As described before, since the electron emission cathode is made of rare earth hexaboride, it provides an advantage that the operation vacuum can be about $1 \times 10^{-5}$ Pa.

EXAMPLE

Examples 1 to 6

Each electron emission cathode structure was prepared by holding an electron emission cathode 1 made of lanthanum hexaboride having an axis direction of <100> by a pair of block heaters 2 of pyrolytic carbon, each attached to each holder 3 provided at the other end of each of a pair of conductive terminals 5 which were brazed to an insulator 4. A tip of each electron emission cathode 1 made of lanthanum hexaboride had a cone angle of 60°. Several kinds of electron emission cathodes having a circular flat surface (Examples 1 to 3) or a spherical shape (Examples 4 to 6) were prepared.

Figure 2:
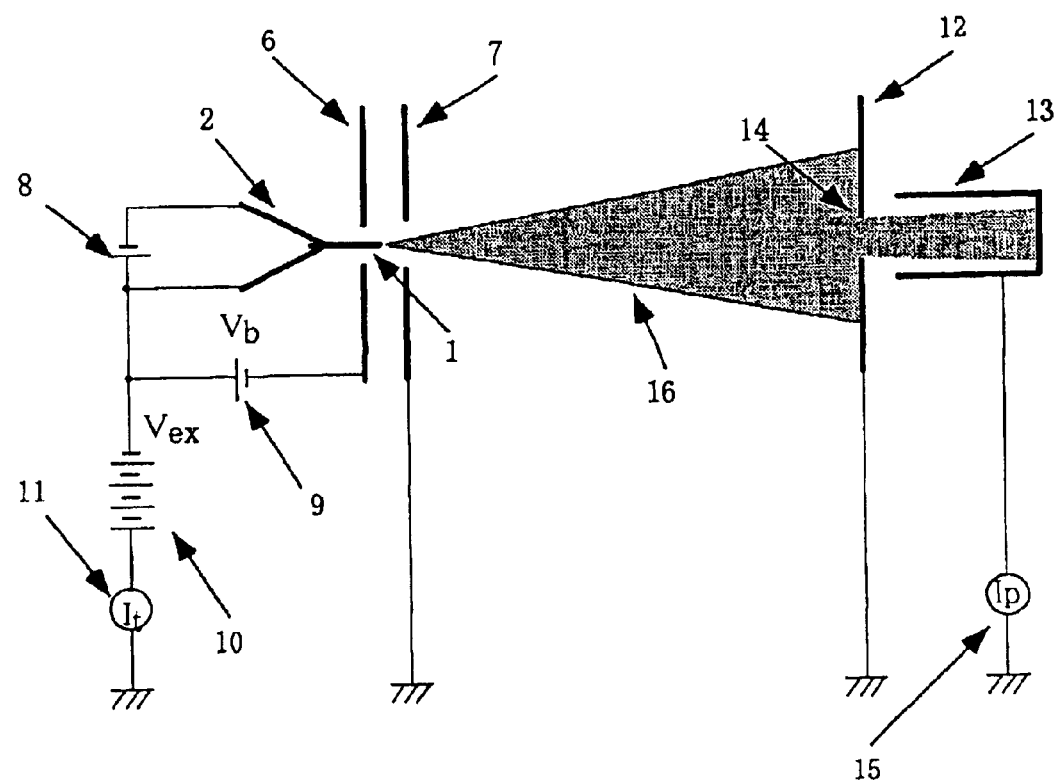
FIG. 2 is a construction diagram of an equipment for evaluating electron emission characteristics.

Each of the electron emission cathode structures were assembled in the system as shown in FIG. 2 so that the electron emission cathode 1 was located between a control electrode 6 and an extractor 7, whereby an electron gun was prepared. The block heaters 2 of pyrolytic carbon were connected to a heating electric source 8 which was connected to a high voltage electric line 11. A high negative voltage, i.e. an extractor voltage Vex was applied to the extractor 7. The control electrode 6 was connected to a bias power source 10, and a negative voltage, i.e., a bias voltage Vb was applied to the electron emission cathode 1. The total emission current It from the electron emission cathode 1 was measured by an ammeter 11 located between a high voltage source 10 and the earth. Electron beam 16 emitted from the tip of the electron emission cathode 1 was passed through an aperture of the extractor 7 to reach a shielding plate 12. An aperture 14 (a small opening) was formed at a central portion of the shielding plate 12. A probe current Ip passing through the aperture 14 to reach a cup-like electrode 13 was measured by a current micrometer 15.

When a solid angle calculated based on the distance between the aperture 14 and the tip of the electron emission cathode 1 and the inner diameter of the aperture 14 is ω, the angular intensity is Ip/ω. In this case, the distance between the tip of the electron emission cathode 1 and the control electrode 6 is 0.15 mm, the distance between the control electrode 6 and the extractor 7 is 0.8 mm, the diameter of the aperture of the extractor 7 is 0.8 mm and the diameter of the aperture of the control electrode 6 is 0.8 mm.

Figure 3:
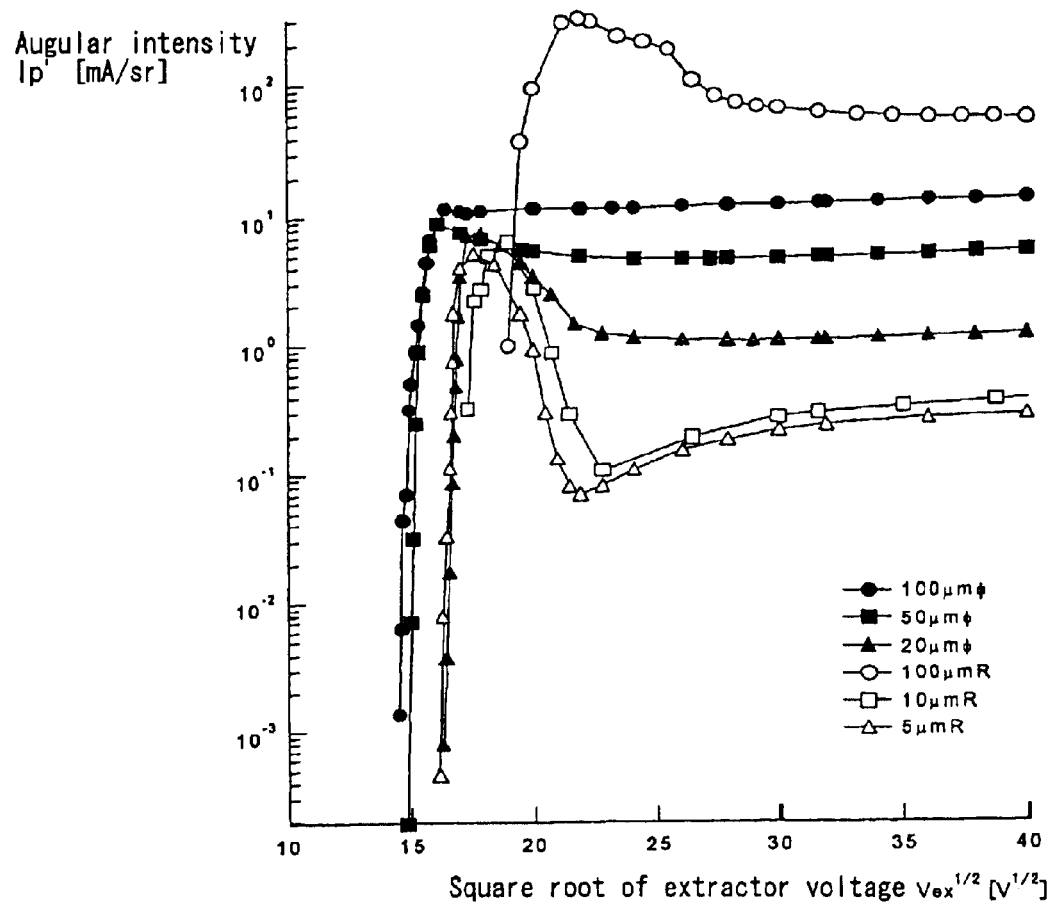
FIG. 3 is a graph showing the relation between an angular intensity and an extractor voltage in the electron gun of the present invention.

The above-mentioned system for evaluating the characteristics was used. The block heaters of pyrolytic carbon 2 were heated by feeding an electric current under a vacuum condition of $1 \times 10^{-5}$ Pa so that the temperature of the electron emission cathode 1 was raised to 1700K. The temperature of the electron emission cathode 1 was measured by an optical pyrometer. The comparison of the electron emission characteristics was made by applying −300V as a bias voltage Vb and changing an extractor voltage Vex while the angular intensity was monitored. A result of measurement is shown in FIG. 3.

The angular intensity increased rapidly with an increase of the extractor voltage and indicated a peak value of 5 mA/sr or more. When the extractor voltage was further raised, the angular intensity did not depend on the extractor voltage. In an attempt that the temperature of the electron emission cathode 1 was changed, it was confirmed that according to the temperature change, the angular intensity was increased or decreased in a temperature limited region. When the temperature of the electron emission cathode 1 is constant in such controlled temperature range, the angular intensity for operation relies on the shape of the tip of the electron emission cathode 1. The angular intensity of each of the electron guns obtained in Examples 1 to 6 wherein the shape of the tip of the electron mission cathode 1 is specified and an extractor voltage Vex of 1 kV is applied, is shown in Table 1.

TABLE 1

|  | Shape of a tip of electron emission cathode | Size of the tip of electron emission cathode | Angular intensity in an extractor voltage of 1 kV [mA/sr] |
|---|---|---|---|
| Example 1 | Circular flat face | 20 μm φ | 1.1 |
| 2 | Circular flat face | 50 μm φ | 4.7 |
| 3 | Circular flat face | 100 μm φ | 12 |
| 4 | Spherical face | 5 μmR | 0.23 |
| 5 | Spherical face | 10 μmR | 0.29 |
| 6 | Spherical face | 100 μmR | 60 |

Comparative Example

For comparison, a commercially available ZrO/W electron emission cathode was attached to the same equipment, and evaluation of the electron emission characteristics was made under a ultra-high vacuum of $1 \times 10^{-7}$ Pa. As a result, the electron emission cathode was damaged due to an arc discharge when the angular intensity exceeded 1 mA/sr, and it was impossible to operate it stably.

In the electron gun according to the present invention, a broad angular intensity of 0.2–70 mA/sr can be obtained without causing failure by an arc discharge, and the angular intensity for operation can be controlled by selecting the shape of the tip of the cathode.

Since the electron gun of the present invention has the above-mentioned features, it is suitable for usage which requires an angular intensity of 1 mA/sr or higher, which could not be achieved in the conventional ZrO/W electron gun, and it is very useful in industry.

What is claimed is:

1. An electron gun comprising:

an electron emission cathode;

a control electrode; and an extractor, wherein the electron emission cathode is made of rare earth hexaboride and a tip of the electron emission cathode is located between the control electrode and the extractor, wherein an electron emission surface of the electron emission cathode is spherical, and wherein an apex angle of the tip portion of the electron emission cathode is 50–100°.

2. The electron gun according to claim 1, wherein the rare earth hexaboride is lanthanum hexaboride.

3. The electron gun according to claim 1, wherein the electron emission cathode is located between two heaters made of carbon so that the electron emission cathode is heated by feeding an electric current to the electron emission cathode and the heaters.

4. The electron gun according to claim 3, wherein the carbon used for the heaters is pyrolytic carbon.

5. The electron gun according to claim 1, wherein an angular intensity of 0.2–70 mA/sr is provided in the application of a driving voltage of 1 kV.

6. An electron gun comprising:

an electron emission cathode;

a control electrode; and an extractor, wherein the electron emission cathode is made of rare earth hexaboride and a tip of the electron emission cathode is located between the control electrode and the extractor, wherein an electron emission surface of the electron emission cathode is circular flat, and wherein a diameter of the flat electron emission surface is 5–200 μm.

7. The electron gun according to claim 6, wherein the electron emission cathode is made of a single crystal of rare earth hexaboride and the electron emission surface of the electron emission cathode has a <100> face.

8. The electron gun according to claim 7, wherein the rare earth hexaboride is lanthanum hexaboride.

* * * * *